US010217661B2

(12) United States Patent
Bruce et al.

(10) Patent No.: US 10,217,661 B2
(45) Date of Patent: Feb. 26, 2019

(54) ARTICLES INCLUDING ULTRA LOW DIELECTRIC LAYERS

(71) Applicant: International Business Machines Corporation, Armonk, NY (US)

(72) Inventors: Robert L. Bruce, White Plains, NY (US); Geraud J. Dubois, Los Altos, CA (US); Gregory Fritz, Wakefield, MA (US); Teddie P. Magbitang, San Jose, CA (US); Hiroyuki Miyazoe, San Jose, CA (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/695,657

(22) Filed: Sep. 5, 2017

(65) Prior Publication Data

US 2017/0365511 A1    Dec. 21, 2017

Related U.S. Application Data

(62) Division of application No. 14/871,305, filed on Sep. 30, 2015, now Pat. No. 9,773,698.

(51) Int. Cl.
*H01L 21/768* (2006.01)
*H01L 21/02* (2006.01)
(Continued)

(52) U.S. Cl.
CPC ...... *H01L 21/76837* (2013.01); *C09D 183/04* (2013.01); *H01L 21/02118* (2013.01);
(Continued)

(58) Field of Classification Search
CPC ............ C09D 183/04; H01L 21/02203; H01L 21/31695; H01L 21/7682; H01L 2221/1047; H01L 21/76837; H01L 21/76885; H01L 21/76825; H01L 21/02126; H01L 21/76828; H01L 21/02216; H01L 21/02282; H01L 23/5329; H01L 23/528; H01L 21/02123;
(Continued)

(56) References Cited

U.S. PATENT DOCUMENTS 5,874,516 A    2/1999  Burgoyne, Jr. et al.
6,242,366 B1   6/2001  Beekman et al.
(Continued)

OTHER PUBLICATIONS

Volksen et al., "Low Dielectric Constant Materials," American Chemical Society, Chemical Reviews, 2010, vol. 110, No. 1, Dec. 4, 2009, pp. 56-110.
Prosecution History from U.S. Appl. No. 14/871,305, dated Sep. 8, 2016 through Jun. 21, 2017, 48 pp.

*Primary Examiner* — Victor A Mandala
(74) *Attorney, Agent, or Firm* — Shumaker & Sieffert, P.A.

(57) ABSTRACT

An article may include a structure including a patterned metal on a surface of a substrate, the patterned metal including metal features separated by gaps of an average dimension of less than about 1000 nm. A porous low dielectric constant material having a dielectric value of less than about 2.7 substantially occupies all gaps. An interface between the metal features and the porous low dielectric constant material may include less than about 0.1% by volume of voids.

20 Claims, 7 Drawing Sheets

(51) Int. Cl.
   *H01L 23/528*   (2006.01)
   *H01L 23/532*   (2006.01)
   *C09D 183/04*   (2006.01)

(52) U.S. Cl.
   CPC .. *H01L 21/02123* (2013.01); *H01L 21/02126* (2013.01); *H01L 21/02203* (2013.01); *H01L 21/02216* (2013.01); *H01L 21/02282* (2013.01); *H01L 21/02318* (2013.01); *H01L 21/02348* (2013.01); *H01L 21/7682* (2013.01); *H01L 21/76825* (2013.01); *H01L 21/76828* (2013.01); *H01L 21/76885* (2013.01); *H01L 23/528* (2013.01); *H01L 23/5329* (2013.01); *H01L 2221/1047* (2013.01); *H01L 2224/27416* (2013.01); *H01L 2224/85447* (2013.01)

(58) Field of Classification Search
   CPC ......... H01L 21/02118; H01L 21/02318; H01L 21/02348; H01L 2224/85447; H01L 2224/27416
   See application file for complete search history.

(56) References Cited

U.S. PATENT DOCUMENTS

| | | | |
|---|---|---|---|
| 6,831,364 B2 | 12/2004 | Dalton et al. | |
| 7,153,783 B2 | 12/2006 | Lu et al. | |
| 8,008,743 B2 | 8/2011 | Gordon et al. | |
| 8,158,521 B2 | 4/2012 | Chang et al. | |
| 2002/0130396 A1 | 9/2002 | Hawker et al. | |
| 2003/0057414 A1* | 3/2003 | Dalton | H01L 21/02126 257/3 |
| 2004/0048960 A1 | 3/2004 | Peterson et al. | |
| 2004/0135254 A1* | 7/2004 | Fujita | H01L 21/02126 257/751 |
| 2005/0113472 A1 | 5/2005 | Fillmore et al. | |
| 2006/0051929 A1 | 3/2006 | Jin et al. | |
| 2011/0298133 A1* | 12/2011 | Oka | H01L 21/02126 257/751 |
| 2012/0156890 A1 | 6/2012 | Yim et al. | |
| 2016/0379874 A1* | 12/2016 | Lin | H01L 21/76837 257/770 |

\* cited by examiner iARTICLES INCLUDING ULTRA LOW DIELECTRIC LAYERS

This application is a Divisional of U.S. application Ser. No. 14/871,305, filed Sep. 30, 2015, now allowed, which is incorporated herein by reference in its entirety.

BACKGROUND

The drive of the semiconductor industry to improve integrated chip performance through scaling has led to the exponential growth of active devices on a chip. The combination of increased device density and shrinking dimensions has led to an increase in the RC (resistance times capacitance) signal delay in the back end of line (BEOL) interconnect wiring. In the past, this problem was addressed by the industry using a three-prong approach. First using alternative chip design, more levels of wiring were added at the smallest wiring dimensions to decrease the signal transit distances. Second, to reduce interconnect resistivity, aluminum was replaced with copper, a metal with ~30% lower resistivity. Finally, capacitance was reduced by replacing the interconnect insulator with a lower dielectric constant material (low k) including the introduction of porosity.

However, the continued drive to improve chip performance through device scaling has led to additional challenges in the BEOL, specifically the increased resistivity stemming from grain boundary scattering in the Cu wiring and damage to the porous low k material caused by patterning and integration. To mitigate both problems an alternate integration approach, subtractive copper etch (sub-etch Cu) was developed to replace the typical damascene integration flow.

FIG. 1 is a flowchart that illustrates a typical subtractive copper etching process. The technique of FIG. 1 starts from a blanket Cu film deposition, thus minimizing electron scattering, and creates Cu lines with large crystals (>1 µm). FIGS. 2A-2D are conceptual diagrams illustrating successive lateral cross-sectional views of an article processed by the technique of FIG. 1.

Step 110 includes forming at least one polish stop 240 on a surface of an integrated circuit substrate 220. The at least one polish stop 240 may assist in attaining a level plane in a subsequent polishing step, for example, chemical mechanical polishing. In some processes, the polish stop 240 may include a material that is harder than the material removed during polishing, for example, metal that may be deposited on the substrate 220 and then polished. Step 130 includes depositing the metal 260 over one or both of the surface of the integrated circuit substrate 220 and the at least one polish stop 240. The metal 260 may include grain boundaries 262. Step 150 includes annealing the deposited metal 260. Step 170 includes polishing the deposited metal 260. Step 190 includes patterning the metal 260 to form metal interconnects 264.

SUMMARY

The metal interconnect lines 264 in FIG. 2D may be filled with ULK interlayer dielectric (ILD) material after the patterning step. Damage to the ULK material that may be subsequently deposited over the metal pattern should be minimized, since the metal 260 is patterned rather than the ULK material itself as in a standard damascene approach.

However, successfully filling the metal interconnect lines 264 with ULK-ILD material, for example, after the patterning (190), presents a major challenge in the implementation of this alternative dual damascene subtractive etch technique. The challenge of filling patterned metal interconnect lines on integrated circuit substrates with defect-free ULK-ILD increases as the metal interconnect line dimensions, for example the average separation between metal interconnect lines, also known as pitch, is decreased, for instance, to 100 nanometers (nm) and below as projected for subsequent technology nodes. Defects may result from incomplete filling, resulting in separation between filling material and metal interconnects, or from the generation of voids, for instance, within the filling material near metal interconnects or at interfaces between metal interconnects and filling materials. Example techniques and articles described in this disclosure provide structures including low-defect or defect-free ULK-ILD filled metal patterns on substrates.

An example technique includes depositing a filling material onto a structure including a patterned metal on a surface of a substrate. The patterned metal includes metal features separated by gaps. The gaps may have an average gap dimension of less than about 1000 nm, for example, an average gap dimension of less than about 100 nm. The filling material includes a silicon-based resin having a molecular weight of less than about 30,000 Da and a porogen having a molecular weight greater than about 400 Da. The deposited filling material is subjected to a predetermined first thermal treatment to substantially fill all gaps with the filling material. The thermally treated deposited filling material is subjected to a second thermal treatment and a UV radiation treatment, thereby crosslinking the silicon-based resin and decomposing the porogen, to form a porous low dielectric constant material having a dielectric value of less than about 2.7. An interface between the metal features and the porous low dielectric constant material includes less than about 0.1% by volume of voids.

In another example, an article includes a structure including a patterned metal on a surface of a substrate. The patterned metal includes metal features separated by gaps of an average dimension of less than about 1000 nm. A porous low dielectric constant material having a dielectric value of less than about 2.7 substantially occupies all gaps. An interface between the metal features and the porous low dielectric constant material includes less than about 0.1% by volume of voids.

The example techniques can be used for the defect free filling of metal interconnect structures with a pitch of 100 nm or less using an ultra low dielectric constant material. In example techniques, the molecular weight ($M_{wr}$) of the resin material is selected to facilitate full penetration and stability upon curing. In examples, porosity may be introduced using a pore generator (porogen) to arrive at low dielectric materials with predetermined dielectric constant (k) values, for example, k<2.7, or even ultra-low dielectric (ULK) materials, for example, k<2.0. A porogen may be an amphiphilic molecule that exhibits a hydrophilic-lipophilic balance (HLB) value. In examples, the porogen's molecular weight ($M_{wp}$) and HLB value are selected to reduce defects. In examples, a combination UV/thermal curing of the resin-porogen hybrid is used to form a fully cured ULK inter-layer dielectric (ULK-ILD) material that exhibits substantially reduced defects or is substantially defect free. For example, a substantially defect-free ULK-ILD material may include no voids or defects having a critical dimension greater than 5 nm. Thus example articles may include substantially integrated circuits including metal lines filled with substantially defect-free ULK-ILD material.

The details of one or more aspects of the invention are set forth in the accompanying drawings and the description below. Other features, objects, and advantages of the invention will be apparent from the description and drawings, and from the claims.

BRIEF DESCRIPTION OF DRAWINGS

The foregoing and other aspects of this invention are made more evident in the following Detailed Description, when read in conjunction with the attached Drawing Figures, wherein.

It should be understood that features of certain Figures of this disclosure may not necessarily be drawn to scale, and that the Figures present non-exclusive examples of the techniques disclosed herein.

DETAILED DESCRIPTION

Figure 1:
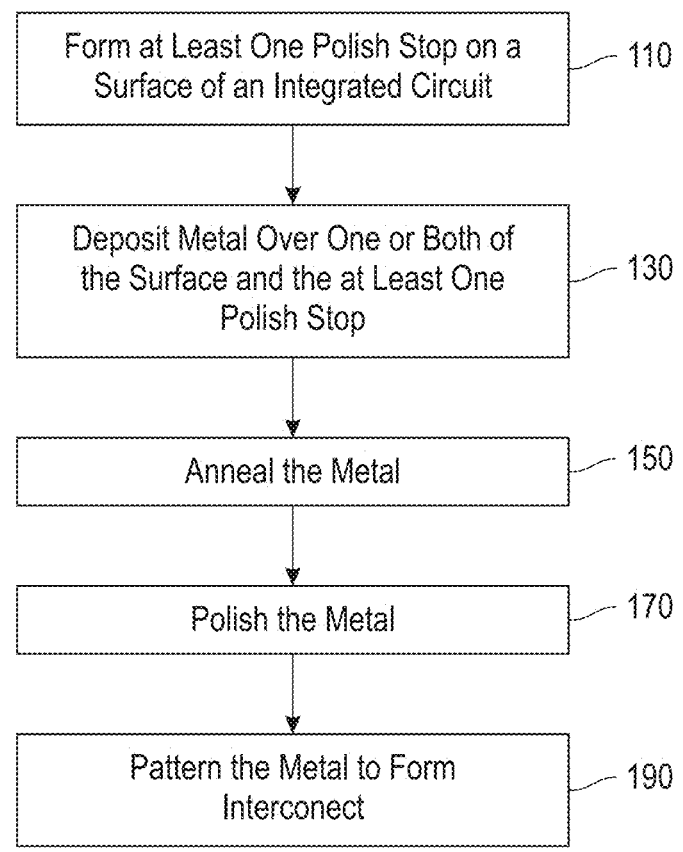
FIG. 1 is a flowchart illustrating an example technique of subtractive copper etching.
Figure 2A:
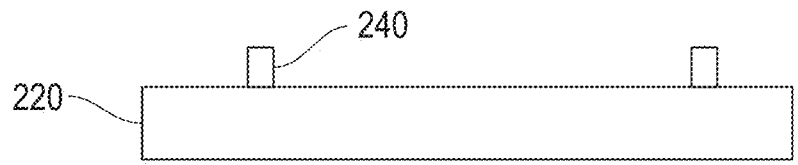
FIGS. 2A-2D are conceptual diagrams illustrating successive lateral cross-sectional views of an article processed by the example technique of FIG. 1.
Figure 2B:
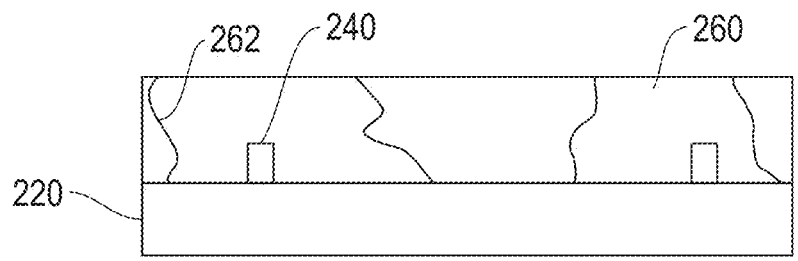
Figure 2C:
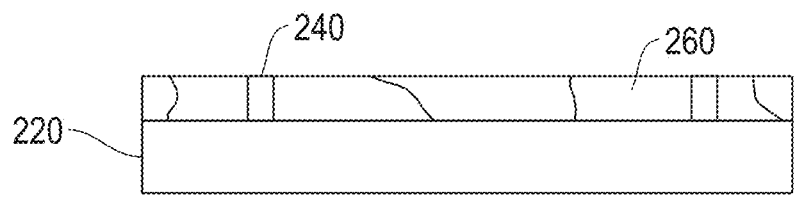
Figure 2D:
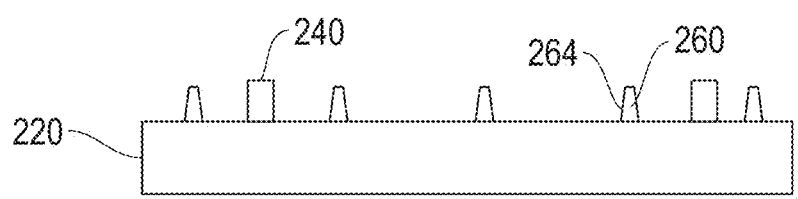
Figure 3A:
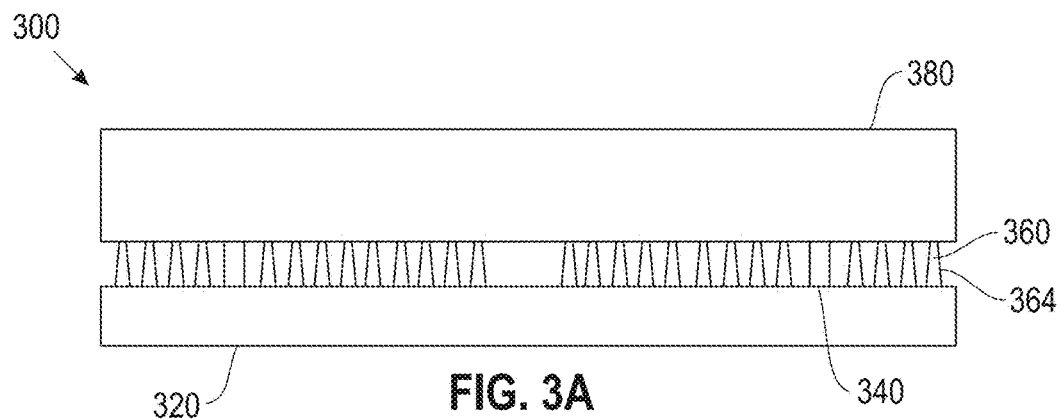
FIGS. 3A-3C are conceptual lateral cross-sectional views of a structure including a patterned metal and a filling material.
Figure 3B:
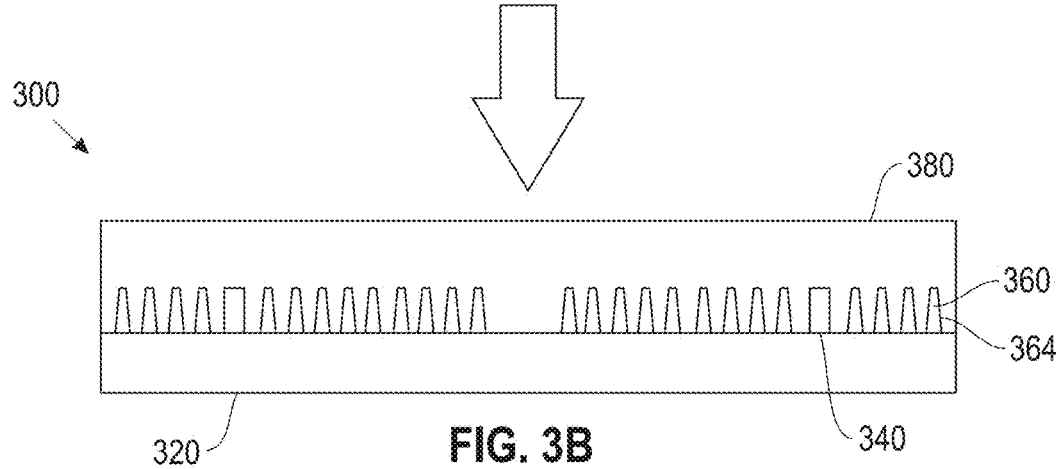
Figure 3C:
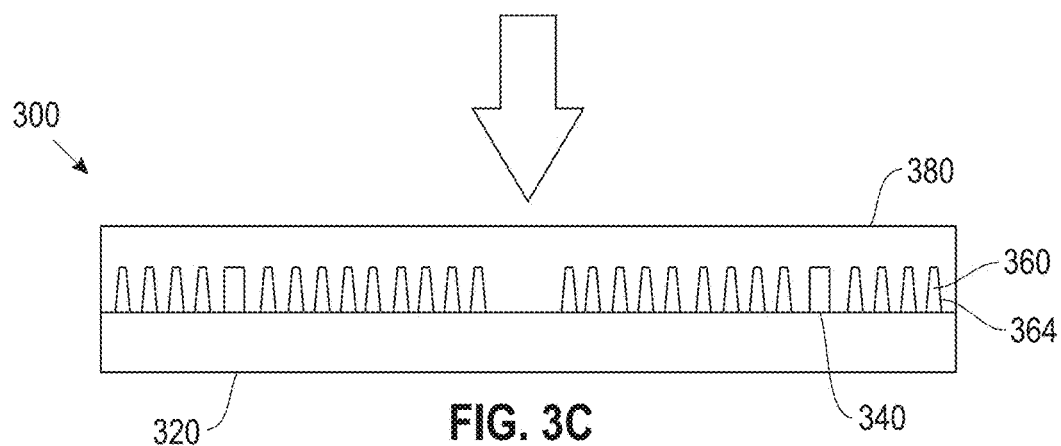

FIGS. 3A-3C are conceptual lateral cross-sectional views of a structure including a patterned metal and a filling material. As shown in FIG. 3A, article 300 includes a substrate 320. The substrate 320 may include a substrate in an integrated circuit fabrication process, for example, a wafer that can support structures subsequently fabricated on a surface. In various embodiments, which are not intended to be limiting, the substrate 320 includes at least one of silicon, metal oxide, or gallium arsenide. Article 300 may also include polish stops 340 on the surface of substrate 320 that may remain after metal patterning has been performed on substrate 320, for example, as described with reference to FIG. 1 above. Article 300 includes metal features 364 disposed on a major surface of the substrate 320. The metal features 364 may include metal interconnects, for example, metal interconnects including metal 360. In an example, metal 360 includes a metal or alloy. For example, metal 360 may include copper, aluminum, or an alloy of copper or aluminum, or any other metal or alloy suitable for use in integrated chips. Metal features 364 may be formed by a subtractive metal patterning technique including subtractive etching, for example, as described above with reference to FIG. 1. For example, the metal features 364 may be present in the form of metal interconnects on substrate 320, separated by gaps, as shown in FIG. 3A. The gaps may have an average gap dimension, for example, a gap length or separation distance, of less than about 1000 nm. In examples, the average gap dimension of the gaps separating metal features 364 may be less than about 1000 nm, less than about 500 nm, less than about 300 nm, or less than about 100 nm. For example, the average gap dimension of the gaps separating metal features 364 may be less than about 100 nm. The gaps may be subsequently filled with a filling material, for example, dielectric material, as described below.

The patterned metal including metal features 364 on substrate 320 may be filled with a filling material 380. Initially, filling material 380 may be deposited as a layer on the surface of substrate 320 presenting the metal features 364, as shown in FIG. 3A. The filling material 380 may include a composition that forms a porous low dielectric constant material on subsequent treatment, for example, thermal treatment and curing. In examples, the filling material 380 may include a curable or cross-linkable resin, for example, organosilicate or siloxane, or any suitable silicon-based resin. In various embodiments, the filling material 380 may include a low-molecular-weight thermosetting polymer, e.g., a soluble silsesquioxane dissolved in a suitable organic solvent. In various non-limiting examples, the silicon-based resin has a molecular weight of less than about 30,000 Daltons (Da), or less than about 20,000 Da, or less than about 10,000 Da, or less than about 5000 Da, or about 3000 Da, or less than about 3000 Da.

The filling material 380 may include other components apart from a dielectric-forming material. In some embodiments, the filling material 380 includes an optional porogen, which in this application refers to a component with appropriate thermal properties to act as a pore generator. A porogen may include any chemical compound or species that promotes the formation of pores in a surrounding matrix. For example, the porogen may be sacrificial, and may decompose during or after pore generation when subjected to predetermined conditions, such as one or both of thermal treatment and UV radiation treatment.

In some embodiments, the porogen may include surfactants, or amphiphilic organic compounds that contain hydrophilic groups (known as heads) and hydrophobic groups (known as tails). The balance between the size of the heads and the tails may be measured in terms of the hydrophilic-lipophilic balance (HLB) value. The HLB value may be determined using Griffin's method or Davies' method, and typically ranges from 0 to 20, or even more than 20. The HLB value of a surfactant porogen may influence pore formation, for example, pore size. However, the HLB value can also influence other properties of compositions, for example, void, gap or defect formation within the filling material 380 or between the filling material 380 including the porogen and the metal features 364.

In some embodiments, which are not intended to be limiting, the porogen includes a surfactant or a suitable amphiphilic compound having a predetermined HLB value. Examples of suitable porogens include, but are not limited to, one or more of polyoxyethylene fatty alcohols, sorbitan fatty acid esters, ethoxylated sorbitan fatty acid esters, or ethoxylates, commercial embodiments of which include Brij, SPAN (Sigma-Aldrich), TWEEN (Sigma-Aldrich), or Tergitol (Dow Chemical Company) surfactants, including sorbitan monolaureate (SPAN 20), sorbitan monopalmitate (SPAN 40), sorbitan monostearate (SPAN 60), sorbitan tristearate (SPAN 65), sorbitan monooleate (SPAN 80), sorbitan trioleate (SPAN 85), PEG-20 sorbitan monolaureate (TWEEN 20), PEG-4 sorbitan monolaureate (TWEEN 21), PEG-20 sorbitan monopalmitate (TWEEN 40), PEG-20 sorbitan monostearate (TWEEN 60), PEG-4 sorbitan monostearate (TWEEN 61), PEG-20 sorbitan tristearate (TWEEN 65), PEG-20 sorbitan monooleate (TWEEN 80), polyoxyethylenesorbitan monooleate (TWEEN 81), polyoxyethylenesorbitan trioleate (TWEEN 85), polyethylene glycol hexadecyl ether or polyoxyethylene (2) cetyl ether (Brij 52), polyoxyethylene (10) stearyl ether (Brij 76), polyoxyethylene (20) stearyl ether (Brij 78), polyethylene (100) stearyl ether (Brij 700), secondary alcohol ethoxylate (Tergitol 15-S-15), or other suitable surfactants or combinations thereof.

In some non-limiting examples, the porogen may have an HLB value greater than about 2, greater than about 5, greater than about 10, greater than about 12, greater than about 15, or greater than about 16.

The molecular weight of the porogen may influence pore formation, for example, pore size. However, the molecular weight of the porogen may also influence other properties of compositions, for example, void, gap or defect formation within the filling material 380 or between the filling material 380 including the porogen and the metal features 364. In various embodiments, the porogen may have a molecular weight greater than about 300 Da, greater than about 400 Da, greater than about 700 Da, greater than about 1000 Da, or greater than about 4000 Da.

The porogen may be chosen based on its compatibility with the matrix or the resin in filling material 380. For example, the porogen and the resin may be soluble or compatible in the form of a colloidal dispersion to yield optically transparent solutions. The porogen and resin may also be mutually compatible to produce uniform films or layers after spinning and optically transparent films after the first thermal treatment or hot-plate post-apply bake. The resin or matrix may also sufficiently stiffen or thicken prior to porogen decomposition to resist capillary forces that may act to collapse pores during porogen decomposition.

In some embodiments, the filling material 380 may include about 75 to 85 wt % of resin, and about 15 to 25 wt % of porogen. For example, the filling material 380 may include at least about 75 wt %, 80 wt %, or 85 wt % of resin and lower than or about 25 wt %, 20 wt %, or 15 wt % of the porogen. In examples, the filling material 380 may include less than about 75 wt % of the resin, for example, about 50 wt % of the resin, and about 50 wt % of the porogen.

The filling material 380 may be deposited by dispensing or spin-on coating to obtain a uniform coating or layer on substrate 320. In examples, spin-coating may include spin-coating the filling material 380 on substrate 320 following by hot-plate baking, for example at 75 to 250° C.

The filling material 380 may be subjected to a first thermal treatment, resulting in flow or penetration of the layer of filling material 380 into the patterned metal, to occupy the gaps between the metal features 364, as shown in FIG. 3B. In examples, the first thermal treatment includes heating the deposited filling material 380 to a temperature from about 75° C. to about 250° C. for a time from about 1 minute to about 30 minutes. Heat may be applied by a suitable controlled heat source. While the first thermal treatment may be effective to result in flow or otherwise softening of the filling material 380 to allow the filling material 380 to occupy the gaps between the metal features 364, in examples, the first thermal treatment may be controlled to avoid curing or pore generation, for example, to avoid premature curing or pore generation within the filling material 380. In examples, the first thermal treatment may initiate or promote subsequent curing or pore generation.

In some embodiments, after the first thermal treatment, the thermally treated filling material 380 may be subjected to a second thermal treatment and a UV radiation treatment while occupying the gaps between the metal features 364, as shown in FIG. 3C. In examples, one or both of the second thermal treatment or the UV radiation treatment may result in cross-linking or curing of the filling material 380, for example, of a silicon-based resin in the filling material 380. A heat source may be used to provide heat for the second thermal treatment, and a UV source may be used to generate UV radiation.

In some embodiments, the second thermal treatment includes heating the thermally treated filling material 380 to a temperature between about 300° C. to about 500° C. for a time from about 30 minutes to about 120 minutes. The second thermal treatment may include ramping up, ramping down, or combinations thereof of the filling material between its initial temperature and a temperature between about 300° C. to about 500° C.

In various embodiments, the UV radiation treatment includes subjecting the thermally treated filling material 380 to UV radiation of wavelength from 100 to 400 nm for a time of about 30 seconds to about 300 seconds. The UV radiation treatment may include exposing the filling material 380 to broad wavelength UV, or varying the wavelength over the duration of time. For example, a broad wavelength UV source may be a mercury bulb with a peak wavelength at 365 nm and concentration of about 254 nm. In one non-limiting example, the second thermal treatment includes heating the filling material to 400° C. while subjecting the filling material to a broad wavelength UV for 300 seconds.

In some embodiments, the second thermal treatment and the UV radiation treatment may be simultaneous for at least a predetermined period of time. In examples, the predetermined period of time may include substantially an entire duration of the second thermal treatment. For example, the filling material 380 may be subjected to UV radiation treatment during the second thermal treatment, and additionally one or both of before or after the completion of the second thermal treatment. In some embodiments, the predetermined period of time includes substantially an entire duration of the UV radiation treatment. For example, the filling material 380 may be subjected to the second thermal treatment during the UV radiation treatment, and additionally one or both of before or after the completion of the UV radiation treatment. In some embodiments, the second thermal treatment and the UV radiation treatment may not be simultaneous, and one may follow the other. In other embodiments, the second thermal treatment and the UV radiation treatment may include multiple stages of interspersed, simultaneous, or non-simultaneous phases or one or both of the second thermal treatment and the UV radiation treatment.

In some embodiments, one or both of the second thermal treatment or the UV radiation treatment may result in one or both of pore formation and porogen decomposition, forming pores in the filling material 380 (not shown). For example, the pores formed may range in size from about 1 nm to about 5 nm. In examples, the curing may result in a reduction of the deposited thickness of filling material 380, as shown in FIG. 3C.

The filling material 380 may form a porous low dielectric constant material as a result of one or both of the second thermal treatment and the UV radiation treatment. In examples, the porous low dielectric constant material includes less than about 0.1% by volume, or less than 0.01% by volume of voids. Voids may include non-pore voids formed at interfaces between the filling material 380 and the metal features 364, or voids that are not formed by the porogen. For example, the low dielectric constant material may be substantially free of voids having a critical void dimension greater than about 5 nm, or greater than about 10 nm nm, or greater than about 100 nm. The critical void dimension may be a maximum diameter, a maximum average diameter, a maximum axial length, or a maximum axial length of a void. In examples, the low dielectric constant material may be substantially free of voids, for example, non-pore voids or voids not generated by the porogen.

Figure 4:
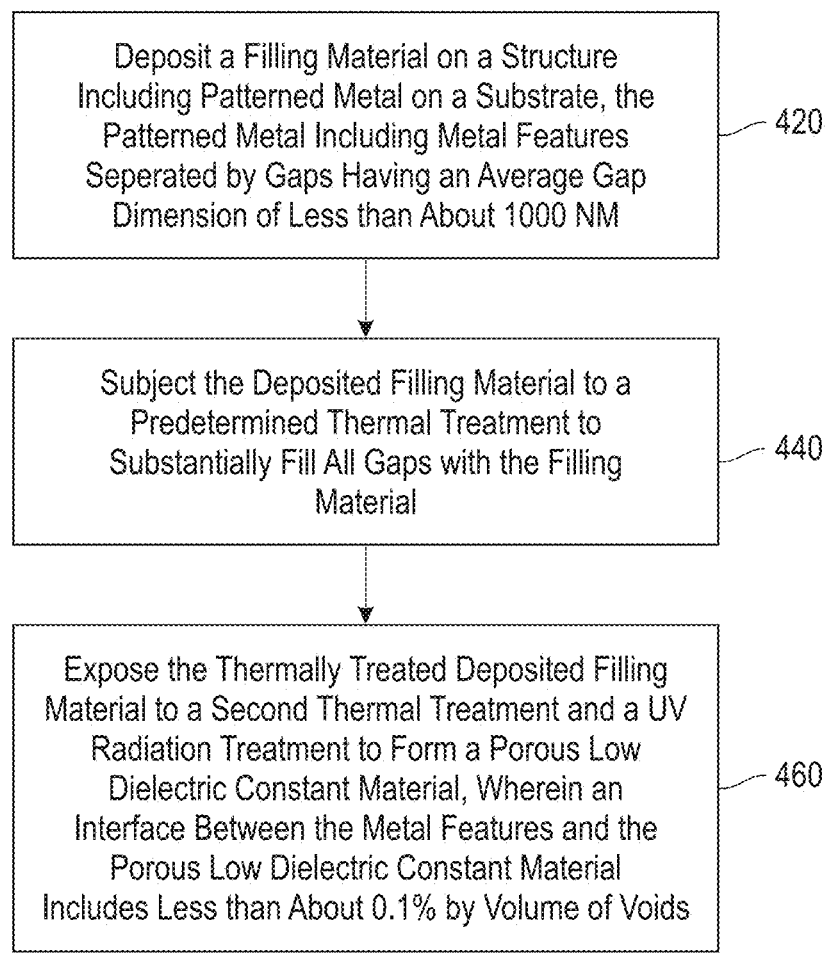
FIG. 4 is a flow diagram illustrating an example technique for filling a patterned material with a filling material.

FIG. 4 is a flow diagram illustrating an example technique for filling a patterned material with a filling material. The example technique may include depositing a filling material onto a structure including a patterned metal on a surface of a substrate (420). The patterned metal may include metal features separated by gaps, the gaps having an average gap dimension of less than about 1000 nm. The filling material may include a silicon-based resin having a molecular weight of less than about 30,000 Da and a porogen having a molecular weight greater than about 400 Da. The example technique may include subjecting the deposited filling material to a first thermal treatment to substantially fill all gaps with the filling material (440). The example technique may include subjecting the thermally treated deposited filling material to a second thermal treatment and a UV radiation treatment, thereby crosslinking the silicon-based resin and decomposing the porogen, to form a porous low dielectric constant material having a dielectric value of less than about 2.7 (460). An interface between the metal features and the porous low dielectric constant material includes less than about 0.1% by volume of voids after one or both of the second thermal treatment and the UV radiation treatment.

Thus, example articles and techniques according to the disclosure provide a structure including a patterned metal on a surface of a substrate, the patterned metal including metal features separated by gaps of an average dimension of less than about 1000 nm, a porous low dielectric constant material having a dielectric value of less than about 2.7 substantially occupying all gaps, such that an interface between the metal features and the porous low dielectric constant material may include less than about 0.1% by volume of voids.

The present disclosure will be illustrated by the following non-limiting examples.

EXAMPLES

Example 1

Figure 5A:
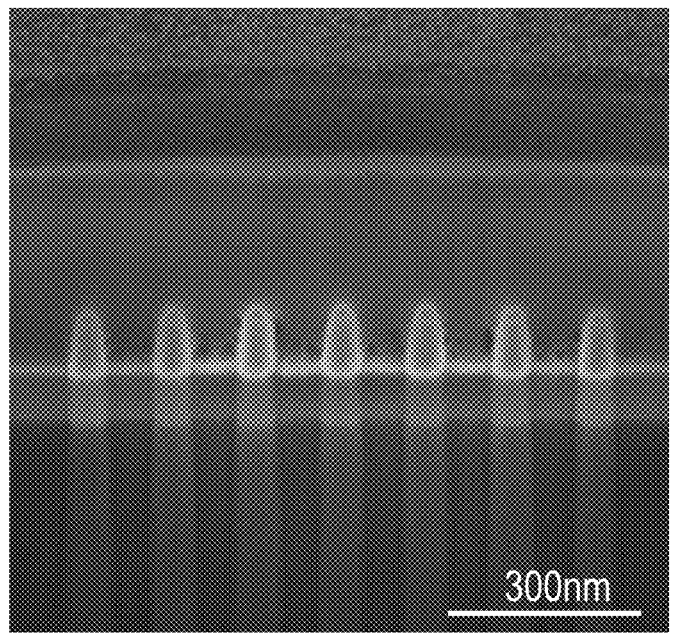
FIGS. 5A and 5B are scanning electron microscopy images of refilled metal structures.
Figure 5B:
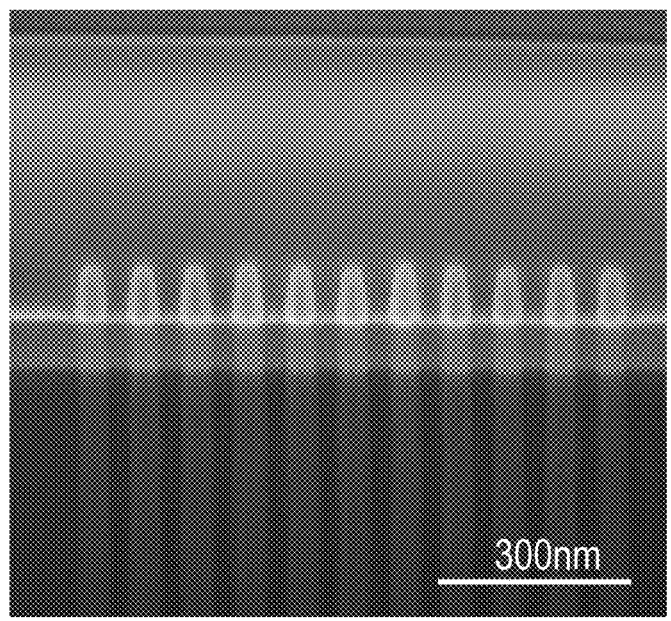

Example 1 presents the selection of molecular weight of Si-based ULK resin material to reduce or avoid the formation of defects. FIGS. 5A and 5B are scanning electron microscopy images of refilled metal structures. As shown in FIG. 5A, using a ULK resin having $M_{wr}$=30,000 Da resulted in incomplete gap-fill, even when the pitch between metal structures was as high as 130 nm. As shown in FIG. 5B, ULK resin having $M_{wr}$=3,000 Da completely filled metal structures, even when the pitch between metal structures was lower, about 80 nm, with no apparent defects or voids. Therefore, ULK resins with $M_{wr}$<30,000 Da result in substantially defect-free filled ULK-ILD over metal interconnects.

Example 2

Example 2 presents the selection of porogen to arrive at a predetermined porosity of the ULK material. Table 1 presents formulation and characterization data of hybrid refill materials using a commercially available Si-based low Mw resin from JSR Corp., Sunnyvale, Calif. with various commercially available surfactants as porogens.

TABLE 1

| Sample | Formulation (wt %) | Porogen $M_{wp}$ | HLB | Thickness (nm) | Refractive Index | Defects |
|---|---|---|---|---|---|---|
| 1 | JSR2015/Brij52 (75/25) | 331 | 5.3 | 455 | 1.3456 | N |
| 2 | JSR2015/Brij76 (80/20) | 711 | 12.4 | 511 | 1.3189 | N |
| 3 | JSR2015/Brij78 (80/20) | 1152 | 15.3 | 575 | 1.314 | Y |
| 4 | JSR2015/Brij700 (85/15) | 4670 | 18.8 | 625 | 1.3066 | N |
| 5 | JSR2015/15-S15 (85/15) | 721 | 15.4 | 590 | 1.3204 | N |

The dielectric constant of sample 5 in Table 1 was found using a metal-insulator-semiconductor (MIS) structure to be 2.4. Since the refractive index is directly proportional to dielectric constant, sample 5 was used as a benchmark for k=2.4 with a corresponding refractive index (RI) of 1.3204. As shown in Table 1, the porogen may have a $M_{wp}$>400 Da in order to have enough efficiency to arrive at the predetermined refractive index and corresponding dielectric constant.

Figure 6:
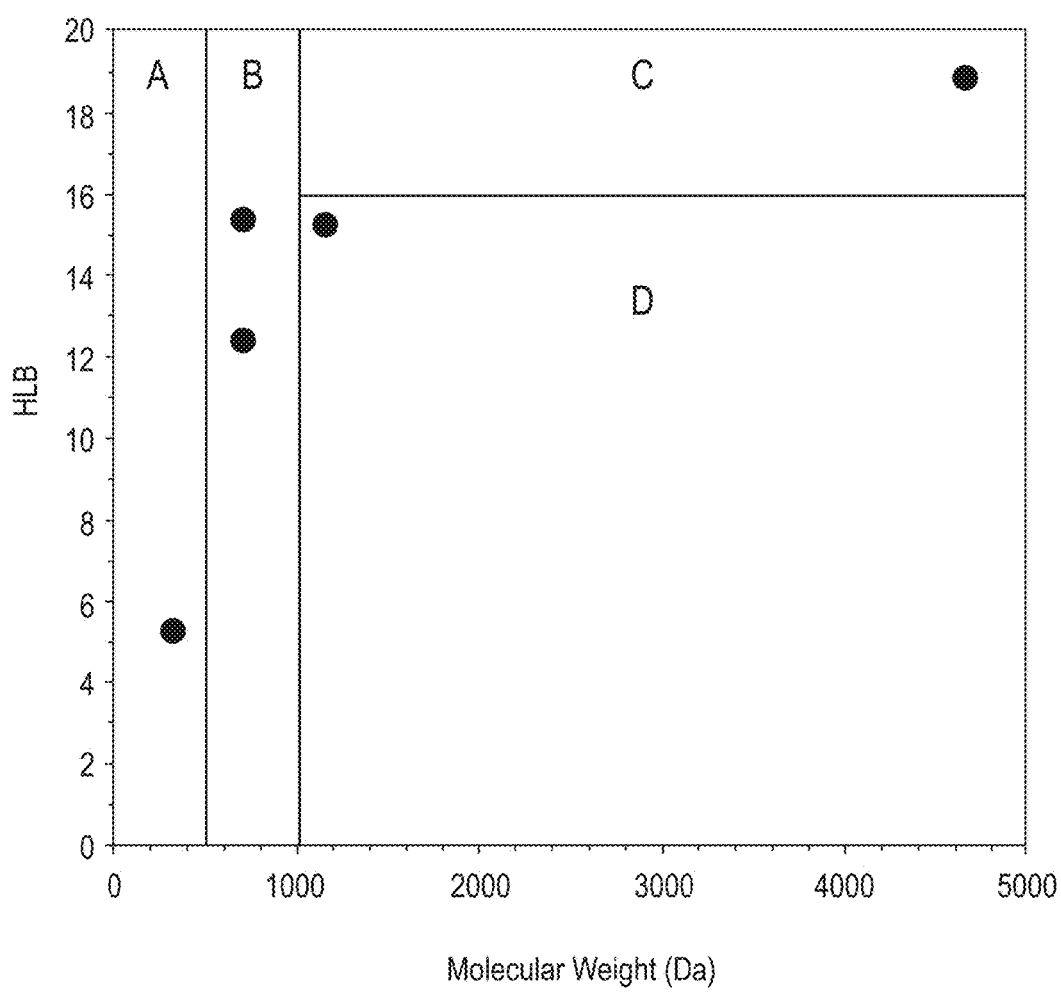
FIG. 6 is a chart illustrating a plot of the porogen's $M_{wp}$ versus HLB, and the selected processing windows for defect free gap-fill of 80 nm pitch metal structures.

In order to achieve a defect free gap-fill, the porogen's $M_{wp}$ and HLB must be selected. FIG. 6 is a plot illustrating the porogen's $M_{wp}$ versus HLB, and the selected processing windows for defect free gap-fill of 80 nm pitch metal structures. Window A, corresponds to samples using porogens with a $M_{wp}$<400 Da, and as previously discussed, does not hit the target dielectric constant regardless of HLB value. Window B, corresponds to samples using porogens with 400<$M_{wp}$<1000 Da, and is shown to produce defect free gap-fill for all HLB values. Window C, corresponds to samples using porogens with $M_{wp}$>1000 Da and HLB values >16, which also produce defect free gap-fill. Finally, window D corresponds to samples using porogens with $M_{wp}$>1000 Da and HLB values <16. Such systems produce incomplete gap-fill or void and defects with critical dimensions greater than 5 nm.

Example 3

Figure 7A:
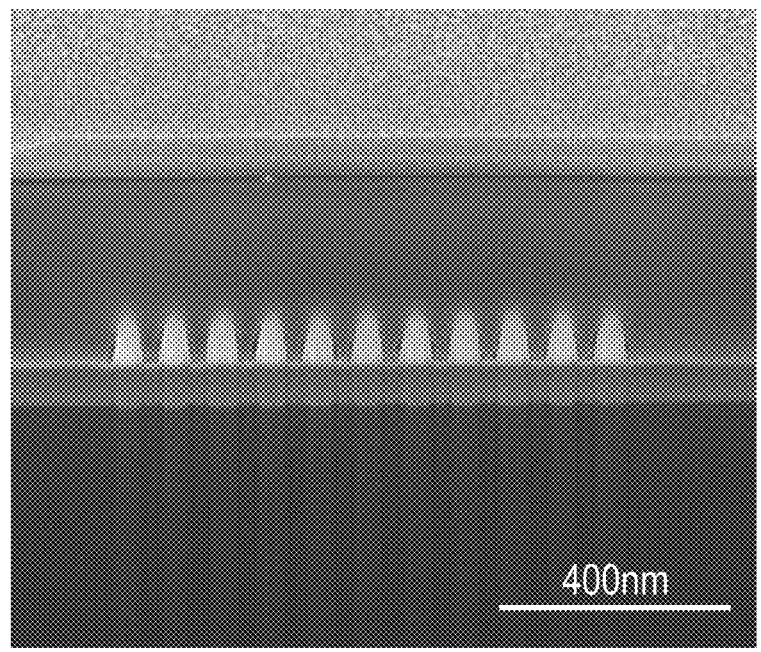
FIGS. 7A and 7B are scanning electron microscopy images of refilled metal structures.
Figure 7B:
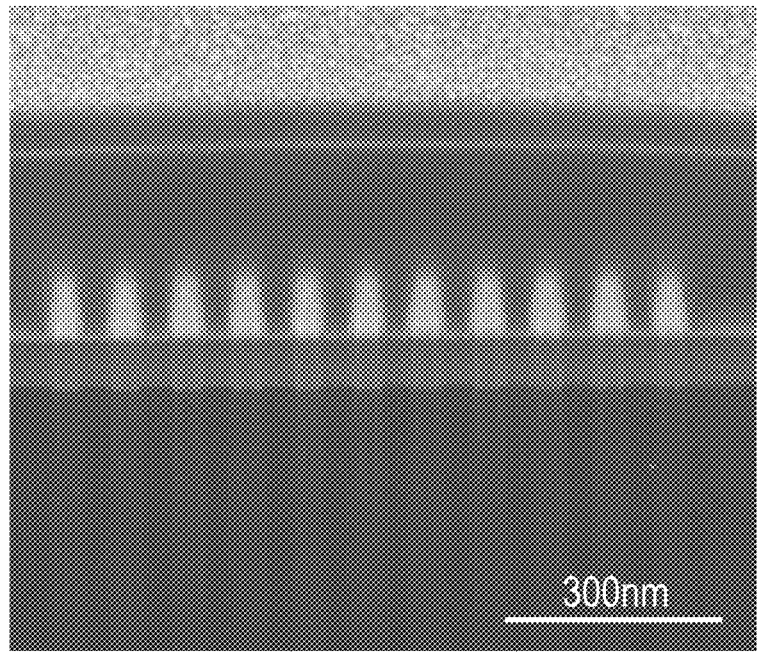

The effect of a combination UV/thermal cure of the hybrid material (resin and porogen) was compared with a thermal cure on the yield of a substantially defect-free fully cured ULK-ILD material. An integrated circuit substrate including metal structures with about 80 nm pitch was filled with resin having the composition of sample 5 of Table 1 and was thermally cured by heating at a rate of 5° C./min from 50° C. to 450° C. The resin was allowed to soak into the metal structures at 450° C. for about 60 minutes. FIG. 7A is a scanning electron microscopy image of metal structures refilled using thermal curing. Defects such as voids are observed in FIG. 7A. In contrast, a combination of UV radiation and thermal curing was found to result in a substantially defect-free cured dielectric material, as shown in FIG. 7B. FIG. 7A is a scanning electron microscopy image of metal structures refilled using combination UV/thermal curing. A resin having the composition of sample 5 of Table 1 was filled in metal structures with a pitch of 80 nm and was cured for 300 seconds at 400° C. The wavelength of the UV radiation was 100 to 400 nm.

Altogether, these results show that one or more of selected values of $M_{wr}$, $M_{wp}$, HLB, and combination UV/thermal curing can be used to obtain substantially defect-free cured ULK-ILD in patterned metal lines in integrated circuit substrates.

Various examples of the invention have been described. These and other examples are within the scope of the following claims.

The invention claimed is:

1. An article comprising:
   a structure comprising a patterned metal on a surface of a substrate, the patterned metal comprising metal features separated by gaps of an average gap dimension of less than about 100 nm; and
   a porous low dielectric constant material having a dielectric value of less than about 2.7 substantially occupying all gaps, wherein an interfacial region between the metal features and the porous low dielectric constant material comprises less than about 0.1% by volume of voids.

2. The article of claim 1, wherein a maximum critical dimension of the voids is less than about 5 nm.

3. The article of claim 1, wherein a maximum critical dimension of the voids is less than about 100 nm.

4. The article of claim 1, wherein the interfacial region is substantially free of voids.

5. The article of claim 1, wherein the average gap dimension is about 80 nm.

6. The article of claim 1, wherein the porous low dielectric constant material comprises a thermally-cured silicon-based material or an ultraviolet (UV)-cured silicon-based material.

7. The article of claim 1, wherein the porous low dielectric constant material comprises a thermally- and UV-cured silicon based material.

8. The article of claim 7, wherein the silicon-based material has a pre-curing molecular weight of less than about 30,000 Da.

9. The article of claim 8, wherein the silicon-based material has a pre-curing molecular weight of less than about 10,000 Da.

10. The article of claim 9, wherein the silicon-based material has a pre-curing molecular weight of about 3,000 Da.

11. The article of claim 1, wherein the porous low dielectric constant material has a dielectric value of about 2.4.

12. The article of claim 1, wherein the porous low dielectric constant material is spin-coated onto the patterned metal.

13. An integrated chip comprising the article of claim 1, wherein the integrated chip comprises metal interconnects, wherein the metal interconnects comprise the metal features.

14. An article comprising:
    an integrated circuit, the integrated circuit comprising:
       a structure comprising a patterned metal on a surface of a substrate, the patterned metal comprising metal features separated by gaps of an average gap dimension of less than about 100 nm; and
       a porous low dielectric constant material having a dielectric value of less than about 2.7 substantially occupying all gaps, wherein an interfacial region between the metal features and the porous low dielectric constant material comprises less than about 0.1% by volume of voids, and wherein a maximum critical dimension of the voids is less than about 5 nm.

15. The article of claim 14, wherein the interfacial region is substantially free of voids.

16. The article of claim 14, wherein the average gap dimension is about 80 nm.

17. The article of claim 14, wherein the porous low dielectric constant material comprises a thermally- and UV-cured silicon based material.

18. The article of claim 17, wherein the silicon-based material has a pre-curing molecular weight of less than about 30,000 Da.

19. The article of claim 18, wherein the silicon-based material has a pre-curing molecular weight of about 3,000 Da.

20. The article of claim 14, wherein the porous low dielectric constant material has a dielectric value of about 2.4.

* * * * *